(12) United States Patent
Ryu

(10) Patent No.: US 8,070,902 B2
(45) Date of Patent: Dec. 6, 2011

(54) METHOD FOR MANUFACTURING A SOLAR CELL MODULE AVAILABLE FOR THE SUNROOF OF A VEHICLE

(76) Inventor: Jae-Hak Ryu, Goyang-si (KR)

( * ) Notice: Subject to any disclaimer, the term of this patent is extended or adjusted under 35 U.S.C. 154(b) by 398 days.

(21) Appl. No.: 12/440,418

(22) PCT Filed: May 3, 2007

(86) PCT No.: PCT/KR2007/002167
§ 371 (c)(1),
(2), (4) Date: Mar. 6, 2009

(87) PCT Pub. No.: WO2008/029982
PCT Pub. Date: Mar. 13, 2008

(65) Prior Publication Data
US 2010/0175819 A1 Jul. 15, 2010

(30) Foreign Application Priority Data
Sep. 8, 2006 (KR) ........................ 10-2006-0086628

(51) Int. Cl.
*B29C 65/00* (2006.01)
*B29C 65/02* (2006.01)
*B30B 9/00* (2006.01)
(52) U.S. Cl. ..... 156/228; 156/580; 156/581; 156/583.1; 156/583.3; 100/295

(58) Field of Classification Search ............ 156/228, 156/242, 250, 252, 253, 256, 580, 581, 583.1, 156/583.2, 583.3; 100/295
See application file for complete search history.

(56) References Cited

U.S. PATENT DOCUMENTS

| | | | |
|---|---|---|---|
| 3,565,719 A | * | 2/1971 | Webb ............................ 156/212 |
| 5,494,546 A | * | 2/1996 | Horvath ........................ 156/102 |
| 6,039,390 A | | 3/2000 | Agrawal et al. |
| 6,241,916 B1 | | 6/2001 | Claussen et al. |
| 6,257,022 B1 | * | 7/2001 | Caplan et al. ................... 65/107 |
| 6,406,090 B1 | | 6/2002 | Tolinski et al. |
| 6,688,681 B2 | | 2/2004 | Birt |
| 2006/0000642 A1 | * | 1/2006 | Dittmann ...................... 174/267 |

* cited by examiner

*Primary Examiner* — Mark A Osele
*Assistant Examiner* — Christopher C Caillouet
(74) *Attorney, Agent, or Firm* — IPLA P.A.; James E. Bame

(57) ABSTRACT

A method for manufacturing a solar cell module for a vehicle sunroof is disclosed, in which a solar cell is cut into multiple pieces so that it can be closely adhered to a curved glasses of a sunroof which is generally installed at an intermediate portion of a vehicle roof so as to provide a driver with an air circulation effect in the interior of a vehicle and a fresh driving feeling with its open environment. A solar cell module for a sunroof is manufactured based on a high temperature and vacuum compression work using a laminator as an EVA film adhering unit. So, it is possible to easily perform a laminating work for adhering a sunroof curved glass and a solar cell as compared to a conventional art in which it is not easy to perform the above work.

9 Claims, 5 Drawing Sheets

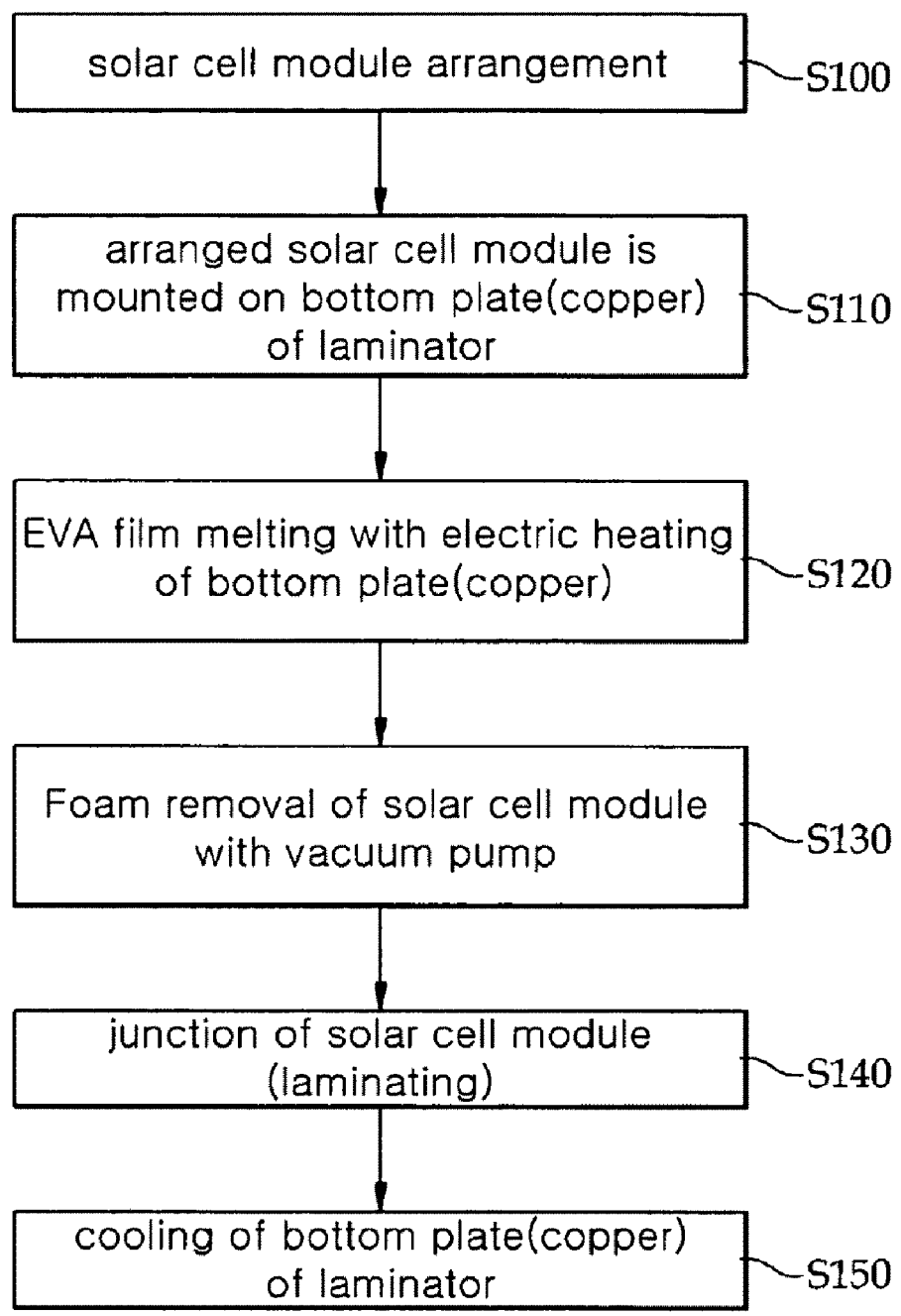
[Fig. 1]

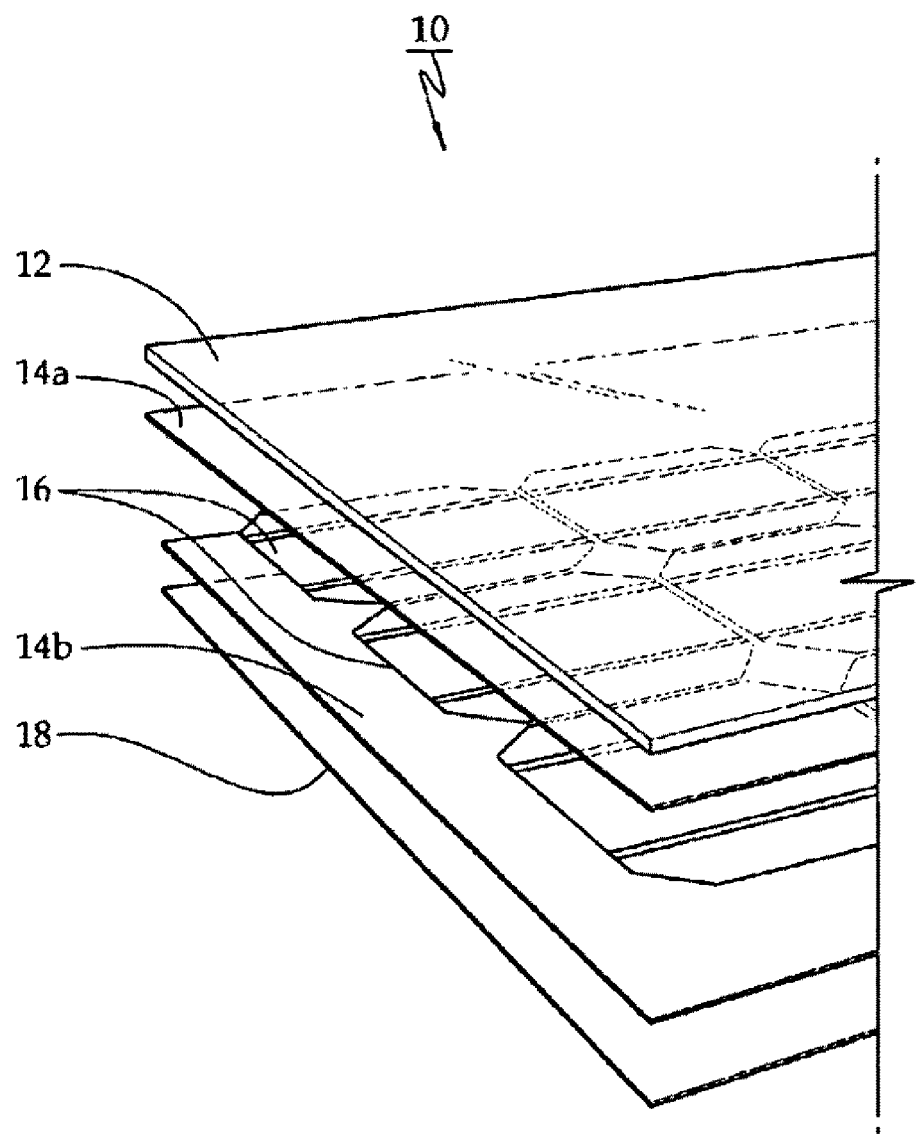
[Fig. 2]

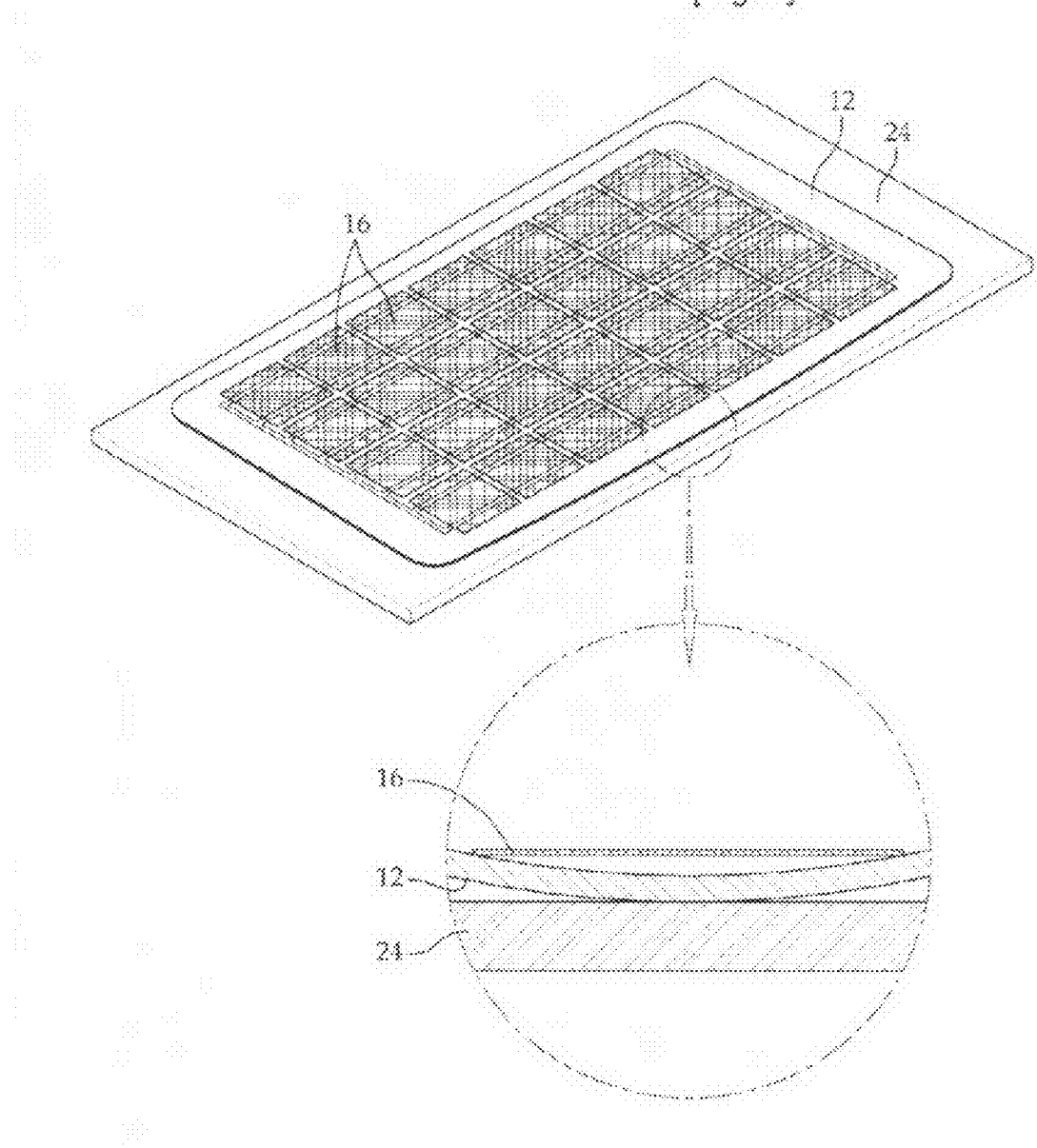

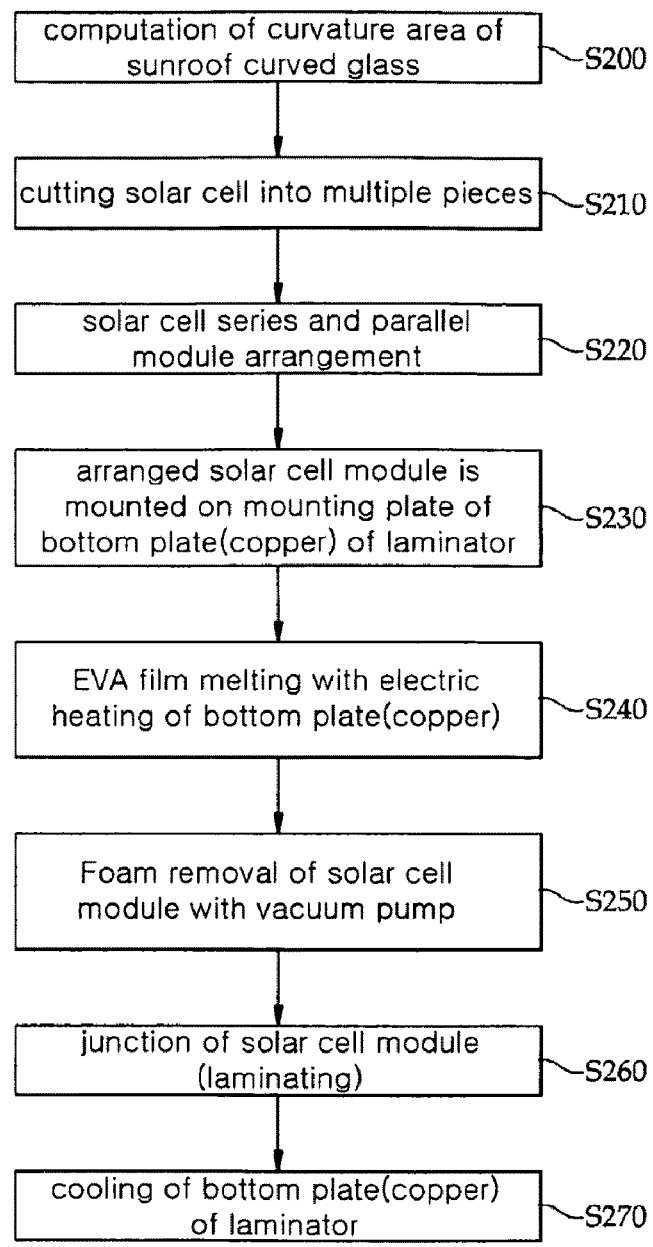
[Fig. 4]
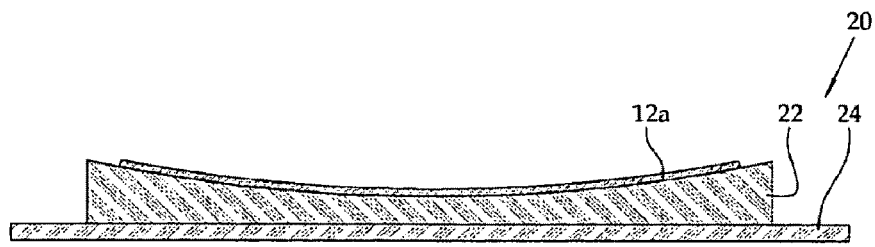
[Fig. 5]

[Fig. 6]
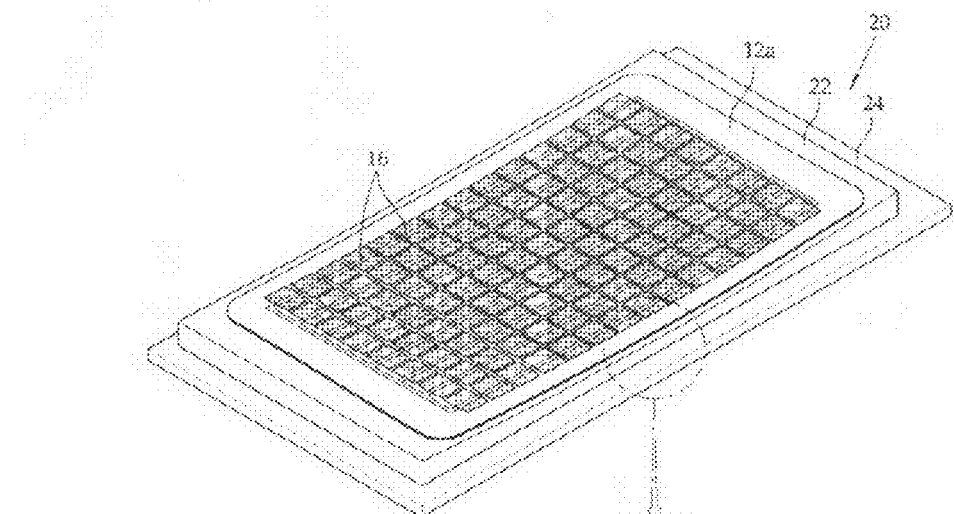
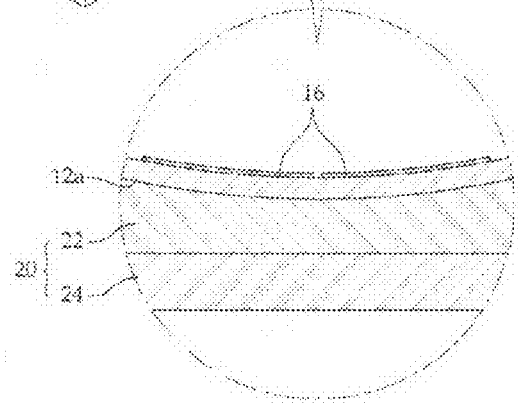
[Fig. 7]
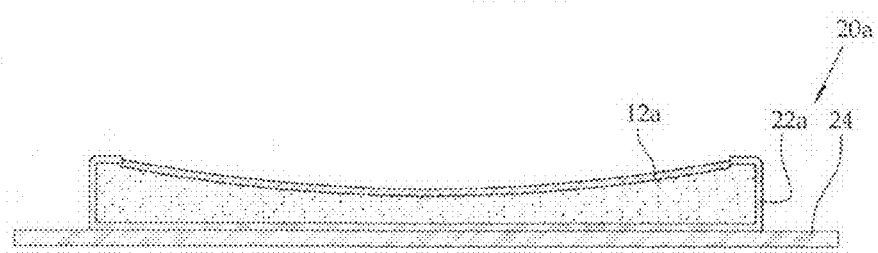
[Fig. 8]
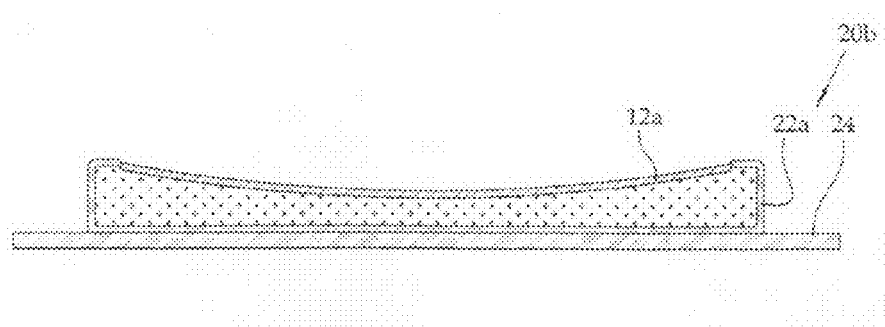

METHOD FOR MANUFACTURING A SOLAR CELL MODULE AVAILABLE FOR THE SUNROOF OF A VEHICLE

TECHNICAL FIELD

The present invention relates to a method for manufacturing a solar cell module for a sunroof of a vehicle, and in particular to a method for manufacturing a solar cell module for a sunroof of a vehicle in which a solar cell is cut into multiple pieces so that it can be closely adhered to a curved glasses of a sunroof which is generally installed at an intermediate portion of a vehicle roof so as to provide a driver with an air circulation effect in the interior of a vehicle and a fresh driving feeling with its open environment. A solar cell module for a sunroof is manufactured based on a high temperature and vacuum compression work using a laminator as an EVA film adhering unit. So, it is possible to easily perform a laminating work for adhering a sunroof curved glass and a solar cell as compared to a conventional art in which it is not easy to perform the above work. In particular, since a laminating work for adhering a sunroof curved glass and a solar cell is performed via a bottom plate of a laminator which is manufactured to have the same curvature as the sunroof curved glass, it is possible to manufacture based on the curvature of the sunroof curved glass for thereby achieving an easier and economical manufacture as compared to the conventional art in which the entire structure of the laminator is changed. With the above features, it does not cost too much, and a sale price of the product can be decreased.

BACKGROUND ART

Generally, a solar cell module is a semiconductor device which is able to convert a light energy into an electric energy using a photoelectric effect and has a big attention since it is a no-pollution, a no-noise, a limitless energy supply source, etc.

In particular, so as to prevent an earth warming phenomenon, a Tokyo protocol was issued on Feb. 16, 2005 for regulating a discharge amount of warming gases such as carbon dioxide, methane gas, etc. In case of Korea which depends on the import of energy by above 80%, a solar energy is only of the alternate energy sources.

The solar cell module is able to generate power using a plurality of solar cells which are connected in series or parallel via a conductive ribbon. A user uses the power as a commercial power. In recent years, it is installed at a building roof, a building wall surface, a mountain area, an island, a park, a traffic signal, and a road guide board for supplying a power thereto.

A conventional solar cell module 10 arranged in a sequence of a low iron tempered glass 12, a lower EVA film 14a, a solar cell 16, an upper EVA film 14b, and a backseat 18 is compressed at a high temperature and under a vacuum environment via a laminator (not shown). It is manufactured in a flat shape via a junction between the upper and lower EVA films 14a and 14b and a junction between the tempered glass 12 and the EVA films 14a and 14b. The manufacturing method of the above solar cell module 10 will be described. As shown in FIG. 1, the method for manufacturing the same comprises a step S100 in which the solar cell 16 is first connected with an interconnecting ribbon, and as shown in FIG. 2, the solar cell module 10 is arranged in a sequence of a flat low iron tempered glass 12, a lower EVA film 14a, a solar cell 16, an upper EVA film 14b, and a back seat 18, a step S110 in which the arranged solar cell module 10 is mounted so that the low iron tempered glass 12 among the arranged solar cell module 10 is positioned on a bottom copper plate 24 of the laminator, a step S120 in which an upper cover (not shown) of the laminator is closed, and the laminator is operated, and the upper and lower EVA films 14a and 14b are melted and adhered based on an electric heating operation as the electric power is supplied to the bottom copper plate 24 contacting with the low iron tempered glass 12, a step S130 in which the inner air of the laminator is sucked using a vacuum pump for thereby removing the foams generated at the side of the solar cell module 10, a step S140 in which the upper and lower EVA films 14a and 14b are adhered by pressurizing the solar cell module 10 by supplying a compression air from an upper chamber of the laminator using a compressor, and a step S150 in which that the heat of the bottom copper plate 24 is cooled using water so that the inner temperature of the laminator is decreased after the junction of the solar cell module 1 is finished. With the above steps, the flat solar cell module 10 is manufactured.

However, there are some problems in actually installing the conventional flat solar cell module 10 at a curved glass 12a of the sunroof installed at an intermediate portion of the roof of the vehicle for the following reasons. Namely, the glass of the conventional solar cell module 10 is formed of a low iron tempered glass 12 in a flat structure with a thickness of about 3.2~4 mm. In case of the solar cell 16 attached to the low iron tempered glass 12, it is made with a silicon wafer, so that it is too fragile. Since the solar cell module 10 is manufactured by laminating an EVA film on the flat glass, it is needed to pressurize the solar cell module 10 in a structure that the solar cell 16 is mounted on the curved glass 12a of the sunroof with above 80 psi using the upper chamber of the laminator so as to laminate the sunroof curved glass 12a and the solar cell 16 using the laminator in a state that the above structure is adapted to the sunroof curved glass 12a. As shown in FIG. 3, in this case, a certain space is formed between the sunroof curved glass 12a and the solar cell 16 owing to the curvature of the sunroof curved glass 12a. So, during the lamination, the sunroof curved glass 12a and the solar cell 16 may be broken.

In addition, during a lamination for a junction between the sunroof curved glass 12a and the solar cell 16, since the sunroof curved glass 12a and the solar cell 16 are broken by means a pressurizing pressure applied from the upper chamber of the laminator, it is impossible to manufacture the solar cell module 10 in which the solar cell 16 is adhered to the sunroof curved glass 12a.

In addition, so as to perform a laminating work for a junction between the sunroof curved glass 12a and the solar cell 16, it is needed to change or newly manufacture the entire structure of the conventional laminator based on the curvature of the sunroof curved glass 12a for thereby causing much inconvenience and structural problems. So, an economical burden increases.

When the entire structure of the laminator is change or a new structure is made based on the curvature of the sunroof curved glass 12a, the manufacturing cost unit and sale price may significantly increase.

DISCLOSURE OF INVENTION

Technical Problem

Accordingly, it is an object of the present invention to provide a method for manufacturing a solar cell module for a vehicle sunroof which overcomes the problems encountered in the conventional art.

It is another object of the present invention to provide a method for manufacturing a solar cell module for a vehicle sunroof in which a solar cell is cut into multiple pieces so that it can be closely adhered to a curved glasses of a sunroof which is generally installed at an intermediate portion of a vehicle roof so as to provide a driver with an air circulation effect in the interior of a vehicle and a fresh driving feeling with its open environment. A solar cell module for a sunroof is manufactured based on a high temperature and vacuum compression work using a laminator as an EVA film adhering unit. So, it is possible to easily perform a laminating work for adhering a sunroof curved glass and a solar cell as compared to a conventional art in which it is not easy to perform the above work.

It is further another object of the present invention to provide a method for manufacturing a solar cell module for a vehicle sunroof in which in case of a sunroof solar cell module manufactured based on a method according to the present invention, since a lamination work for a junction between a sunroof curved glass and a solar cell is performed based on a bottom plate of a laminator which allows the same curvature as the sunroof curved glass, it is possible to overcome the problems that an entire structure of the laminator is changed or a new laminator is manufactured based on the curvature of a sunroof curved glass. In addition, it is possible to significantly decrease the manufacturing unit cost and sale price of the products manufactured based on the present invention.

Technical Solution

In a method for adhering a solar cell module to a vehicle sunroof using a laminator, there is provided a method for manufacturing a solar cell module for a vehicle sunroof which comprises a step in which a curvature area of a sunroof curved glass is computed for a full contact of a solar cell to the sunroof curved glass; a step in which the solar cell is cut into multiple pieces so that the solar cell is closely contacted with the sunroof curved glass based on a computed curvature area of the sunroof curved glass; a step in which a solar cell module is arranged in a sequence of a sunroof curved glass, a lower EVA film, a solar cell, an upper EVA film, and a backseat including the cut solar cell; a step in which the arranged solar cell module is mounted so that the sunroof curved glass is positioned on a bottom plate of the laminator; a step in which an upper chamber (cover) of the laminator is closed and operates, and the upper and lower EVA films are melted based on an electric heating operation of the bottom plate contacting with the sunroof curved glass; and a step in which the solar cell module is adhered using the upper and lower EVA films which melt as the solar cell module is pressurized by means of the compressed air supplied from the upper chamber of the laminator.

Advantageous Effects

In the method for manufacturing a solar cell module for a sunroof of a vehicle according to the present invention, a solar cell is cut into multiple pieces so that it can be closely adhered to a curved glasses of a sunroof which is generally installed at an intermediate portion of a vehicle roof so as to provide a driver with an air circulation effect in the interior of a vehicle and a fresh driving feeling with its open environment. A solar cell module for a sunroof is manufactured based on a high temperature and vacuum compression work using a laminator as an EVA film adhering unit. So, it is possible to easily perform a laminating work for adhering a sunroof curved glass and a solar cell as compared to a conventional art in which it is not easy to perform the above work.

In addition, in case of a sunroof solar cell module manufactured based on a method according to the present invention, since a lamination work for a junction between a sunroof curved glass and a solar cell is performed based on a bottom plate of a laminator which allows the same curvature as the sunroof curved glass, it is possible to overcome the problems that an entire structure of the laminator is changed or a new laminator is manufactured based on the curvature of a sunroof curved glass. In addition, it is possible to significantly decrease the manufacturing unit cost and sale price of the products manufactured based on the present invention.

BRIEF DESCRIPTION OF THE DRAWINGS

FIG. 1 is a block diagram illustrating a method for manufacturing a conventional solar cell module.

FIG. 2 is a view illustrating an arrangement of a solar cell module of FIG. 1.

FIG. 3 is a view illustrating a construction when a conventional flat solar cell and a sunroof curved glass manufactured based on a method of FIG. 1 are adhered.

FIG. 4 is a block diagram illustrating a method for manufacturing a solar cell module for a vehicle sunroof according to the present invention.

FIG. 5 is a front view illustrating a bottom plate of a laminator according to the present invention.

FIG. 6 is a view illustrating a construction of a solar cell module for a vehicle sunroof manufactured based on a method of FIG. 4 according to the present invention.

FIG. 7 is a view illustrating another embodiment of a bottom plate of a laminator according to the present invention.

FIG. 8 is a view illustrating further another embodiment of a bottom plate of a laminator according to the present invention.

BEST MODE FOR CARRYING OUT THE INVENTION

In the present invention, in a method for adhering a solar cell module to a vehicle sunroof using a laminator, there is provided a method for manufacturing a solar cell module for a vehicle sunroof which comprises a step in which a curvature area of a sunroof curved glass is computed for a full contact of a solar cell to the sunroof curved glass; a step in which the solar cell is cut into multiple pieces so that the solar cell is closely contacted with the sunroof curved glass based on a computed curvature area of the sunroof curved glass; a step in which a solar cell module is arranged in a sequence of a sunroof curved glass, a lower EVA film, a solar cell, an upper EVA film, and a backseat including the cut solar cell; a step in which the arranged solar cell module is mounted so that the sunroof curved glass is positioned on a bottom plate of the laminator; a step in which an upper chamber (cover) of the laminator is closed and operates, and the upper and lower EVA films are melted based on an electric heating operation of the bottom plate contacting with the sunroof curved glass; and a step in which the solar cell module is adhered using the upper and lower EVA films which melt as the solar cell module is pressurized by means of the compressed air supplied from the upper chamber of the laminator.

The bottom plate of the laminator is formed as a module mounting plate contacting with a sunroof curved glass among the solar cell module to be mounted and a support bottom plate supporting the module mounting plate are integrally formed, and said module mounting plate is made in a channel shaped frame structure of a copper material same as the support bottom plate, and a powder of a phosphorus bronze and an aluminum is inputted into the interior of the frame, and the inputted phosphorous bronze and aluminum powders are heated using the heat from the support bottom plate and are pressurized on the sunroof curved glass for thereby obtaining the same curvature as the sunroof curved glass.

The bottom plate of the laminator is formed as a module mounting plate contacting with a sunroof curved glass among the solar cell module to be mounted and a support bottom plate supporting the module mounting plate are integrally formed, and said module mounting plate is made in a channel shaped frame structure of a copper material same as the support bottom plate, and a powder mixed with a white silica powder and a plaster powder and water are inputted into the interior of the frame and are mixed and hardened and molded in a state that the sunroof curved glass is mounted for thereby obtaining the same curvature as the sunroof curved glass.

Mode for the Invention

The method for manufacturing a solar cell module for a vehicle sunroof according to the present invention will be described with reference to the accompanying drawings.

FIG. 4 is a block diagram illustrating a method for manufacturing a solar cell module for a vehicle sunroof according to the present invention. FIG. 5 is a front view illustrating a bottom plate of a laminator according to the present invention. FIG. 6 is a view illustrating a construction of a solar cell module for a vehicle sunroof manufactured based on a method of FIG. 4 according to the present invention.

In a method for adhering a solar cell module 10a to a vehicle sunroof using a laminator, there is provided a method for manufacturing a solar cell module 10a for a vehicle sunroof which comprises a step S200 in which a curvature area of a sunroof curved glass 12a is computed for a full contact of a solar cell to the sunroof curved glass; a step S210 in which the solar cell 16 is cut into multiple pieces so that the solar cell 16 is closely contacted with the sunroof curved glass 12a based on a computed curvature area 12a of the sunroof curved glass; a step S220 in which a solar cell module 10a is arranged in a sequence of a sunroof curved glass 12a, a lower EVA film 14a, a solar cell 16, an upper EVA film 14b, and a backseat 18 including the cut solar cell 16; a step S230 in which the arranged solar cell module 10a is mounted so that the sunroof curved glass 12a is positioned on a bottom plate 20 of the laminator; a step S240 in which an upper chamber (cover) of the laminator is closed and operates, and the upper and lower EVA films 14a and 14b are melted based on an electric heating operation of the bottom plate 20 contacting with the sunroof curved glass 12a; and a step S260 in which the solar cell module 10a is adhered using the upper and lower EVA films 14a and 14b which melt as the solar cell module 10a is pressurized by means of the compressed air supplied from the upper chamber of the laminator.

There are further provided a step S250 in which the foams generated at the solar cell module by 10a sucking the inner air of the laminator using a vacuum pump after the upper and lower EVA films 14a and 14b are melted by heating a solar cell module 10a, which is arranged in a sequence of a sunroof curved glass 12a, a lower EVA film 14a, a solar cell 16, an upper EVA film 14b, and a backseat 18, based on an electric heating operation of the bottom plate 20 of the laminator; and a step S270 in which the heat of the cooper plate is heated using a cooling water so that the inner temperature of the laminator can decrease after the solar cell module 10a is adhered.

Before the description of the method for manufacturing a solar cell module 10a for a vehicle sunroof according to the present invention, the laminator for a junction of the cellular cell module 10a arranged in a sequence of a sunroof curved glass 12a, a lower EVA film 14a, a solar cell 16, an upper EVA film 14b, and a backseat 18 will be first described.

In case of the laminator, in the solar cell module 10a arranged in a sequence of a sunroof curved glass 12a, a lower EVA film 14a, a solar cell 16, an upper EVA film 14b, and a backseat 18, there are provided a bottom plate 20 for melting and adhering the upper and lower EVA films 14a and 14b via an electric heating operation as a module mounting plate 22 for mounting the sunroof curved glass 12a and a support bottom plate 24 for supporting the module mounting plate 22 are integrally formed, and an upper chamber for covering the laminator and for pressurizing and adhering the solar cell module 10a melted and adhered with the upper and lower EVA films 14a and 14b based on an electric heating operation of the bottom plate 20.

In a state that the interior of the laminator is sealed by covering the upper chamber of the laminator, the air is sucked between the upper and lower EVA films 14a and 14b and between the entire solar cell module 10a which are to be melted and adhered based on the electric heating operation of the bottom plate 20, and the foams are removed between the solar cell modules 10a, so that a vacuum state is formed. As the compressed air is supplied to the vacuum pump (not shown) and the upper chamber of the laminator, and the solar cell module 10a is pressurized. In a state that the upper and lower EVA films 14a and 14b are melted and adhered based on the electric heating operation of the bottom plate 20, the solar cell modules 10a are adhered with each other. For the above operations, a compressor is provided.

As shown in FIG. 5, in case of the bottom plate 20, the temperature is increased to about 150° C. based on the electric heating operation at which the upper and lower EVA films 14a and 14b are heated and melted, and the solar cell module 10a is adhered, namely, at which the solar cell module 10a can be laminated. At this time, the module mounting plate 22 is made of a copper plate (with more than about 10 mm thickness) having an excellent electric heating performance. It is made with the same curvature as the sunroof curved glass 12a so that it can be closely mounted along with the sunroof curved glass 12a when it is mounted on the sunroof curved glass 12a. In case of the support bottom plate 24 which is integrally formed with the module mounting plate 22, it is made of a copper plate or an aluminum material which is the same as the module mounting plate 22 so that heat can be easily transferred to the module mounting plate 22. The solar cell module 10a is adhered to the inner surface of the bottom plate 20 based on the electric heating operation, and the inner temperature of the laminator, namely, the temperature (about 40~60° C.) of the bottom plate 20 is decreased based on the cooling operation performed as the cooling water circulates. So, a worker can remove the solar cell module 10a adhered with the sunroof curved glass 12a and the solar cell 16 from the laminator. For the above operations, a pipe shaped cooling water flow pipe (not shown) is provided.

In case of the upper chamber, an inner surface of the same is made of a silicon material rubber plate (diapergram) so that a pressure of 80~100 psi (550~700 kPa) can be pressurized to the solar cell module 10a as it is expanded by means of the compressed air from the compressor. It has an extension rate of about 600%, and it can endure the temperature of about 200° C.

The solar cell module 10a arranged in a sequence of a sunroof curved glass 12a, a lower EVA film 14a, a solar cell 16, an upper EVA film 14b, and a backseat 18 is mounted on the bottom plate 20 of the laminator. At this time, the sunroof curved glass 12a is installed at an intermediate portion of the vehicle roof. When the inner temperature increases in summer, it is opened, and the inner air of the vehicle is forced to fast circulate, so that a driver can feel freshness. It is generally made of a high strength glass which is specially heat-treated and is able to block ultraviolet ray as well as infrared ray. It is made with a constant curvature so that the cross section of the glass is concave inwardly.

In addition, in case of the solar cell 16, it is generally made of silicon materials. Based on its manufacturing method, it can be classified into a single silicon solar cell (not shown), and a multi or poly silicon solar cell. Based on its size and generation power, it can be classified into 4 inches, 5 inches, 6 inches, and 8 inches. At this time, the average thickness of the solar cell is about 180~350 um, and the average power generation amount is 1.4 w in case of 4 inches, 2.3 W in case of 5 inches, 3.3 W in case of 6 inches, and about 5 W in case of 8 inches.

At this time, the solar cell 16 is cut based on the curvature of the sunroof curved glass 12a. The above operation will be described with respect to the solar cell 16 of 5 inches.

In case that the 5 inches solar cell 16 is cut based on the curvature of the sunroof curved glass 12a, the size of one piece of the cut solar cell 16 is 41.7×62.5 mm, and the output of one piece of the cut solar cell 16 is 0.48V, and 0.79 A. At this time, six pieces of the solar cell 16 are connected in series, so that the total output of the cut solar cell 16 is 0.48V×6=2.88V, and 2.88V×0.7983 A=2.299 A. The above result is similar with the total power generation amount of the 5 inches solar cell 16 which is not cut. When the solar cell 16 is cut, the area of the solar cell 16 may lose by the number of cuttings as long as 0.04 mm which corresponds to the width of the blade of the diamond. Since the width of the same is too thin, it does not largely affect the total output value of the cut solar cell 16.

In case of the solar cell 16, a silver line is printed on the front surface of the same along with a silver paste. At this time, the silver line has an interval of about 1.5~3 mm between two lines in a vertical direction, and the width of the line is about 0.1~0.5 mm in a horizontal direction. The above silver line is formed at an interval of 2~4 mm. At this time, the silver line formed in a vertical direction corresponds to a portion adhered with an interconnecting ribbon for connecting the solar cells in series and parallel. The silver lines formed on the front surface of the solar cell in vertical and horizontal directions are used for collecting the electric power from the solar cell 16. Namely, the silver lines of about 0.1~0.5 mm formed in a horizontal direction collects the power from the solar cell 16, and the silver lines of about 1.5~3 mm formed in the vertical direction collect the power.

The upper and lower EVA films (Ethylene Vinyl Acetate Film) 14a and 14b, which are a synthetic resin of an adhering member of the solar cell module 10a, are melted based on an electric heating operation of the bottom plate 20 of the laminator for thereby adhering the solar cell module 10a arranged in a sequence of a sunroof curved glass 12a, a lower EVA film, a solar cell 16, an upper EVA film 14b, and a backseat 18. It is a copolymer of ethylene and vinyl acetate and has an excellent feature of an invisible feature, a cushion and elastic feature and a tension strength. In particular, the lower EVA film 14a is formed of two sheets of films as compared to the upper EVA film 14b contacting with the backseat 18. The EVA film melted based on an electric heating operation of the bottom plate 20 of the laminator is inputted into a gap between the solar cells 16 mounted on the sunroof curved glass 12a and fills the gap, and the foam layers formed at the solar cell module 10a are fully removed based on the vacuum de-foam operation of the laminator using the vacuum pump.

In case of the backseat 18 which is positioned at the highest position of the solar cell module 10a and contacts with the upper chamber of the laminator, it is manufactured based on the method for manufacturing a backseat 18 for a solar cell module (Korean patent registration number 0612411) which was filed by the same applicant as the present invention and was registered on Aug. 7, 2006 in which a tedlar film is attached to both sides of the PET film. It is used for a waterproof and insulation and for blocking a ultraviolet ray. In addition, it allows the life span of the solar cell module 10a to be extended with the help of its excellent durability which well endures a high temperature and moisture.

As shown in FIG. 7, there is shown a method for manufacturing the solar cell module 10a for a vehicle sunroof according to the present invention. In a laminator used for a laminating work of the solar cell module 10a for a vacuum pressurization at a high temperature. Namely, there is shown another embodiment of the bottom plate 20a for adhering the solar cell modules 10a by heating and melting the upper and lower EVA films 14a and 14b based on the electric heating operation. As shown therein, the module mounting plate 22a contacting with the sunroof curved glass 12a in the solar cell module 10a mounted on the laminator and the support bottom plate 24 supporting the module mounting plate 22a are integrally formed. In case of the module mounting plate 22a, it is formed in a channel shape same using a copper material same as the support bottom plate 24. Powders of phosphorus bronze and aluminum are inputted into the interior of the frame. The powders of phosphorus bronze and aluminum inputted along with heat from the support bottom plate 24 are heated and pressurized on the sunroof curved glass 12a, so that the same curvature as the sunroof curved glass 12a is obtained.

At this time, the powders of phosphorus bronze and aluminum inputted into the module mounting plate 22a is formed in a size of 250 mesh so that a heat transfer from the support bottom plate 24 and the module mounting plate 22 can be easily performed. The temperature of the support bottom plate 24 is heated to 160° C. through 170° C. for 0.5 or 1 hour so that the temperature of the inner side of the frame of the module mounting plate 22a becomes 150° C. for an adhering work (laminating) of the solar cell module 10a including the sunroof curved glass 12a, so that the same curvature is obtained by means of the sunroof curved glass 12a.

As shown in FIG. 7, there is shown a method for manufacturing the solar cell module 10a for a vehicle sunroof according to the present invention. In a laminator used for a laminating work of the solar cell module 10a for a vacuum pressurization at a high temperature. Namely, there is shown further another embodiment of the bottom plate 20a for adhering the solar cell modules 10a by heating and melting the upper and lower EVA films 14a and 14b based on the electric heating operation. As shown therein, line the bottom plate 20a of the laminator of the above another embodiment of the present invention of FIG. 7, the module mounting plate 22a contacting with the sunroof curved glass 12a in the solar cell module 10a mounted on the laminator and the support bottom plate 24 supporting the module mounting plate 22a are integrally formed, except that the module mounting plate 22a is made in a channel shaped frame structure with the same material of copper material as the support bottom plate 24. In addition, as shown in FIG. 8, a powder mixed with white silica powder and plaster powder and water are inputted and mixed and hardened in a state that the sunroof curved glass 12a is mounted, so that the same curvature as the sunroof curved glass 12a is obtained.

At this time, in case of white silica powder and plaster powder inputted into the module mounting plate 22a, the mixing ratio is 5:5 or 6:4 based on the size of the particle of white silica powder. When the mixing ratio is 5:5, the size of the particle of the while silica powder is 16 through 20 mesh, and when it is 6:4, the size of the same is 30 through 60 mesh. The temperature of the support bottom plate 24 is heated to 180° C. through 190° C. for 1 or 1.5 hours so that the temperature of the inner side of the frame of the module mounting plate 22a becomes 150° C. for an adhering work (laminating) of the solar cell module 10a including the sunroof curved glass 12a, so that the same curvature is obtained by means of the sunroof curved glass 12a.

The preferred embodiments of the present invention with respect to the manufacture method for a solar cell module 10a for a vehicle sunroof will be described with reference to FIG. 4.

Embodiment

As shown in FIG. 5, the solar cell 16 is closely contacted with the sunroof curved glass 12a for a junction by means of the laminator. The curvature area of the sunroof curved glass 12a is computed in a step S200. The solar cell 16 is cut into multiple pieces in a step S210 so that the solar cell 16 can fully contact with the surface of the sunroof curved glass 12a based on the computed curvature area of the sunroof curved glass 12a.

In addition, the solar cell module 10a is arranged in a step S220 in a sequence of a sunroof curved glass 12a, a lower EVA film 14a, a solar cell 16, an upper EVA film 14b, and a backseat 18 including the cut solar cell 16, and then the arranged solar cell module 10a is mounted in a step S230 so that the sunroof curved glass 12a is positioned on the module mounting plate 22 made of the copper material formed with the same curvature as the sunroof curved glass 12a while having an integration with the bottom plate 20 of the laminator, namely, the support bottom plate 24. The upper chamber corresponding to the cover of the laminator is closed for thereby sealing the interior of the laminator.

In a state that the interior is sealed by closing the upper chamber of the laminator, the laminator operates, and an electric heating operation is performed as electric power is supplied from the bottom plate 20 contacting with the sunroof curved glass 12a. At this time, the upper and lower EVA films 14a and 14b slowly start melting in a step S240. The temperature of the bottom plate 20, namely, the module mounting plate 22 increases to 150° C. at which the junction (laminating) work of the solar cell module 10a including the sunroof curved glass 12a can be efficiently performed based on the electric heating operation. At the same time, the solar cell module 10a arranged in a sequence of a sunroof curved glass 12a, a lower EVA film 14a, a solar cell 16, an upper EVA film 14b, and a backseat 18 is heated based on the electric heating operation of the bottom plate 20 of the laminator, and the upper and lower EVA films 14a and 14b are melted. The inner air of the laminator is sucked using the vacuum pump, and the foams generating in the entire portions of the solar cell module including the upper and lower EVA films 14a and 14b are removed in a step S250.

In a state that the inner air of the laminator, namely, the foams generated in the entire portions of the solar cell module 10a including the upper and lower EVA films 14a and 14b are removed using the vacuum pump, the solar cell module 10a is pressurized via the rubber plate of the inner side of the upper chamber expanded as the compressed air is supplied using the compressor connected with the upper chamber of the laminator. At this time, the upper chamber pressurizes the solar cell module 10a with a pressure of 80~100 psi (550~700 kPa) with the help of the compressed air supplied. In a step S260, the solar cell module 10a arranged in a sequence of a sunroof curved glass 12a, a lower EVA film 14a, a solar cell 16, an upper EVA film 14b, and a backseat 18 is adhered using an adhering member of the upper and lower EVA films 14a and 14b which are melted based on the pressurizing operation.

Next, as the final step, when the junction of the solar cell module 10a is finished based on the pressurizing operation of the upper chamber of the laminator, in a step S270, the bottom plate 20 of the laminator is cooled so that the junction-finished solar cell module 10a can be discharged from the interior of the laminator. The cooling process is performed as the cooling water circulates along the cooling water flow pipe installed in the interior of the bottom plate 20 of the laminator. The temperature of the bottom plate 20 is decreased by means of the cooling water, and the upper chamber of the laminator is opened, and the solar cell module 10a in which the solar cell 16 is adhered to the sunroof curved glass 12a, namely, the solar cell module 10a for a vehicle sunroof is separated and discharged from the bottom plate 20 of the laminator, namely, from the module mounting plate 22, so that the manufacturing process of the solar cell module 10a for a vehicle sunroof is finished according to the present invention.

INDUSTRIAL APPLICABILITY

In the method for manufacturing a solar cell module for a sunroof of a vehicle according to the present invention, a solar cell is cut into multiple pieces so that it can be closely adhered to a curved glasses of a sunroof which is generally installed at an intermediate portion of a vehicle roof so as to provide a driver with an air circulation effect in the interior of a vehicle and a fresh driving feeling with its open environment. A solar cell module for a sunroof is manufactured based on a high temperature and vacuum compression work using a laminator as an EVA film adhering unit. So, it is possible to easily perform a laminating work for adhering a sunroof curved glass and a solar cell as compared to a conventional art in which it is not easy to perform the above work.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. In a method for adhering a solar cell module to a vehicle sunroof using a laminator, a method for manufacturing a solar cell module for a vehicle sunroof, comprising:
a step in which a curvature area of a sunroof curved glass is computed for a full contact of a solar cell to the sunroof curved glass;
a step in which the solar cell is cut into multiple pieces so that the solar cell is closely contacted with the sunroof curved glass based on a computed curvature area of the sunroof curved glass;

a step in which a solar cell module is arranged in a sequence of a sunroof curved glass, a lower EVA film, a solar cell, an upper EVA film, and a backseat including the cut solar cell;

a step in which the arranged solar cell module is mounted so that the sunroof curved glass is positioned on a bottom plate of the laminator;

a step in which an upper chamber (cover) of the laminator is closed and operates, and the upper and lower EVA films are melted based on an electric heating operation of the bottom plate contacting with the sunroof curved glass; and a step in which the solar cell module is adhered using the upper and lower EVA films which melt as the solar cell module is pressurized by means of the compressed air supplied from the upper chamber of the laminator, wherein said bottom plate of the laminator is formed as a module mounting plate contacting with a sunroof curved glass among the solar cell module to be mounted and a support bottom plate supporting the module mounting plate are integrally formed, and said module mounting plate is made in a channel shaped frame structure of a copper material same as the support bottom plate, and a powder of a phosphorus bronze and an aluminum is inputted into the interior of the frame, and the inputted phosphorous bronze and aluminum powders are heated using the heat from the support bottom plate and are pressurized on the sunroof curved glass for thereby obtaining the same curvature as the sunroof curved glass.

2. The method of claim 1, further comprising a step in which the foams generated at the solar cell module by sucking the inner air of the laminator using a vacuum pump after the upper and lower EVA films are melted by heating a solar cell module, which is arranged in a sequence of a sunroof curved glass, a lower EVA film, a solar cell, an upper EVA film, and a backseat, based on an electric heating operation of the bottom plate of the laminator.

3. The method of claim 2, wherein said lower EVA film is formed of two sheets of films as compared to the upper EVA film contacting with the backseat, and the EVA film melted based on an electric heating operation of the bottom plate of the laminator is inputted into a gap between the solar cells mounted on the sunroof curved glass and fills the gap, and the foam layers formed at the solar cell module are fully removed based on the vacuum de-foam operation of the laminator using the vacuum pump.

4. The method of claim 1, further comprising a step in which the heat of the copper plate is heated using a cooling water so that the inner temperature of the laminator can decrease after the solar cell module is adhered.

5. The method of claim 1, wherein said bottom plate of the laminator is formed as a module mounting plate contacting with a sunroof curved glass among the solar cell module to be mounted and a support bottom plate supporting the module mounting plate are integrally formed, and said module mounting plate has the same curvature as the sunroof curved glass so that it can closet contact when the sunroof curved glass is mounted.

6. The method of claim 5, wherein said module mounting plate is made of a copper plate material, and said support bottom plate is made of a copper plate or an aluminum material which is the same as the module mounting plate for properly transferring heat to the module mounting plate.

7. The method of claim 1, wherein said phosphorous bronze and aluminum powders are made with 250 mesh sizes for an efficient heat transfer from the support bottom plate and module mounting plate, and said support bottom plate is hated to 160.degree. C. through 170.degree. C. for 0.5 through 1 hour so that an inner temperature of the frame of the module mounting plate becomes a temperature of 150.degree. C. at which an adhering (laminating) work of the solar cell module including the sunroof curved glass is performed for thereby performing a molding operation with the same curvature as the sunroof curved glass.

8. In a method for adhering a solar cell module to a vehicle sunroof using a laminator, a method for manufacturing a solar cell module for a vehicle sunroof, comprising:

a step in which a curvature area of a sunroof curved glass is computed for a full contact of a solar cell to the sunroof curved glass;

a step in which the solar cell is cut into multiple pieces so that the solar cell is closely contacted with the sunroof curved glass based on a computed curvature area of the sunroof curved glass;

a step in which a solar cell module is arranged in a sequence of a sunroof curved glass, a lower EVA film, a solar cell, an upper EVA film, and a backseat including the cut solar cell;

a step in which the arranged solar cell module is mounted so that the sunroof curved glass is positioned on a bottom plate of the laminator;

a step in which an upper chamber (cover) of the laminator is closed and operates, and the upper and lower EVA films are melted based on an electric heating operation of the bottom plate contacting with the sunroof curved glass; and a step in which the solar cell module is adhered using the upper and lower EVA films which melt as the solar cell module is pressurized by means of the compressed air supplied from the upper chamber of the laminator, wherein said bottom plate of the laminator is formed as a module mounting plate contacting with a sunroof curved glass among the solar cell module to be mounted and a support bottom plate supporting the module mounting plate are integrally formed, and said module mounting plate is made in a channel shaped frame structure of a copper material same as the support bottom plate, and a powder mixed with a white silica powder and a plaster powder and water are inputted into the interior of the frame and are mixed and hardened and molded in a state that the sunroof curved glass is mounted for thereby obtaining the same curvature as the sunroof curved glass.

9. The method of claim 8, wherein said white silica powder and plaster powder are mixed at a ratio of 5:5 or 6:4 depending on a particle size of the white silica powder, and in case of a mixing ratio of 5:5, the particle size of the white silica powder is 16 through 20 mesh, and in case of a mixing ratio of 6:4, the particle size of a white silica powder is 30 through 60 mesh, and said support bottom plate is hated to 180.degree. C. through 190.degree. C. for 1 through 1.5 hour so that an inner temperature of the frame of the module mounting plate becomes a temperature of 150.degree. C. at which an adhering (laminating) work of the solar cell module including the sunroof curved glass is performed for thereby performing a molding operation with the same curvature as the sunroof curved glass.

* * * * *